United States Patent
Hong et al.

(10) Patent No.: US 7,584,401 B2
(45) Date of Patent: Sep. 1, 2009

(54) CHANNEL INTERLEAVING/DEINTERLEAVING APPARATUS IN A COMMUNICATION SYSTEM USING LOW DENSITY PARITY CHECK CODE AND CONTROL METHOD THEREOF

(75) Inventors: Song-Nam Hong, Seoul (KR);
Jung-Soo Woo, Suwon-si (KR);
Seung-Hoon Park, Seoul (KR);
Deok-Ki Kim, Seongnam-si (KR);
Su-Ryong Jeong, Suwon-si (KR);
Young-Kyun Kim, Seongnam-si (KR);
Dong-Seek Park, Yongin-si (KR)

(73) Assignee: Samsung Electronics Co., Ltd (KR)

( * ) Notice: Subject to any disclaimer, the term of this patent is extended or adjusted under 35 U.S.C. 154(b) by 287 days.

(21) Appl. No.: 11/487,201

(22) Filed: Jul. 14, 2006

(65) Prior Publication Data
US 2007/0033486 A1    Feb. 8, 2007

(30) Foreign Application Priority Data
Jul. 15, 2005    (KR) ............... 10-2005-0064364

(51) Int. Cl.
*H03M 13/00*    (2006.01)

(52) U.S. Cl. ............ 714/755; 714/786; 714/788; 714/762; 714/781

(58) Field of Classification Search ......... 714/755, 714/785–786, 781, 758
See application file for complete search history.

(56) References Cited

U.S. PATENT DOCUMENTS

2006/0218461 A1* 9/2006 Kyung et al. ............ 714/758
2007/0283216 A1* 12/2007 Kyung et al. ............ 714/758

OTHER PUBLICATIONS

Shen et al. 'Low-Density Parity-Check Coded Modulation Using Multiple Signal Maps and Symbol Decoding,' IEEE, pp. 420-424, Jun. 20, 2004.*

* cited by examiner

*Primary Examiner*—Guy J Lamarre
(74) *Attorney, Agent, or Firm*—The Farrell Law Firm, LLP

(57) ABSTRACT

A channel interleaving method and apparatus in a communication system using a low density parity check (LDPC) code. Upon receipt of information data bits, an encoder encodes the information data bits into an LDPC codeword using a predetermined coding scheme. A channel interleaver interleaves the LDPC codeword according to a predetermined channel interleaving rule. A modulator modulates the channel-interleaved LDPC codeword into a modulation symbol using a predetermined modulation scheme.

34 Claims, 8 Drawing Sheets

$$H = \begin{bmatrix} 1 & 0 & 1 & 0 & 1 & 0 & 1 & 0 \\ 1 & 0 & 0 & 1 & 0 & 1 & 0 & 1 \\ 0 & 1 & 1 & 0 & 0 & 1 & 1 & 0 \\ 0 & 1 & 0 & 1 & 1 & 0 & 0 & 1 \end{bmatrix}$$

CHANNEL INTERLEAVING/DEINTERLEAVING APPARATUS IN A COMMUNICATION SYSTEM USING LOW DENSITY PARITY CHECK CODE AND CONTROL METHOD THEREOF

PRIORITY

This application claims the benefit under 35 U.S.C. § 119(a) of an application filed in the Korean Intellectual Property Office on Jul. 15, 2005 and assigned Serial No. 2005-64364, the entire contents of which are incorporated herein by reference.

BACKGROUND OF THE INVENTION

1. Field of the Invention

The present invention relates generally to a channel interleaving/deinterleaving apparatus and a control method thereof, and in particular, to a channel interleaving/deinterleaving apparatus in a communication system using low density parity check codes and a control method thereof.

2. Description of the Related Art

With the rapid development of mobile communication systems, there is a need to develop technology capable of transmitting a large volume of data, approaching the capacity of wire networks, in wireless networks. Due to increasing demand for high-speed, high-capacity communication systems capable of processing and transmitting a variety of information, such as image and wireless data, as well as the voice data, increasing system transmission efficiency using an appropriate channel coding scheme is an essential factor for improvement of the system performance.

However, mobile communication systems, due to their characteristics, may inevitably suffer from an error caused by noise, interference and/or fading according to channel conditions during data transmission. Therefore, mobile communication systems can suffer a loss of information data due to error.

In order to reduce information data loss, mobile communication systems normally use various error control schemes according to channel characteristics, thereby contributing to improvements of system reliability. Of the error control schemes, an error correction code-based error control scheme is most popularly used.

Typical error correction codes include turbo codes and Low Density Parity Check (LDPC) codes.

It is well known that the turbo code is superior in performance gain to a convolutional code conventionally used for error correction, during high-speed data transmission. The turbo code is advantageous in that it can efficiently correct an error caused by noises generated in a transmission channel, thereby increasing reliability of the data transmission. The LDPC code can be decoded using an iterative decoding algorithm based on a sum-product algorithm in a factor graph. Because a decoder for the LDPC code uses a sum-product algorithm-based iterative decoding algorithm, it is lower in complexity than a decoder for the turbo code. In addition, the decoder for the LDPC code is easy to implement with a parallel processing decoder, compared with the decoder for the turbo code.

Shannon's channel coding theorem shows that reliable communication is possible only at a data rate not exceeding a channel capacity. However, Shannon's channel coding theorem has proposed no detailed channel coding/decoding method for supporting a data rate up to the channel capacity limit. Although a random code having a very large block size shows performance approximating the channel capacity limit of Shannon's channel coding theorem, it is actually impossible to implement a Maximum A Posteriori (MAP) or Maximum Likelihood (ML) decoding method because of its heavy calculation load.

The turbo code was proposed by Berrou, Glavieux and Thitimajshima in 1993, and has superior performance approximating the channel capacity limit of Shannon's channel coding theorem. The proposal of the turbo code triggered an active research on iterative decoding and graphical expression of codes, and LDPC codes proposed by Gallager in 1962 are newly spotlighted in the research. Cycles exist in a factor graph of the turbo code and the LDPC code, and it is well known that iterative decoding in the factor graph of the LDPC code where cycles exist is not ideal. Also, it has been experimentally proven that the LDPC code has excellent performance through iterative decoding. The LDPC code known to have the highest performance shows performance having a difference of only about 0.04 decibels at the channel capacity limit of Shannon's channel coding theorem at a bit error rate (BER) $10^{-5}$, using a block size $10^7$. In addition, although an LDPC code defined in Galois field (GF) with q>2, i.e. GF(q), increases in complexity in its decoding process, it is much superior in performance to a binary code. However, there has been provided no satisfactory theoretical description of successful decoding by an iterative decoding algorithm for the LDPC code defined in GF(q).

The LDPC code, proposed by Gallager, is defined by a parity check matrix in which major elements have a value of 0 (Null) and minor elements except for the elements having the value of 0 have a non-zero value, for example, i.e. a value of 1. For convenience, it will be assumed herein that the non-zero value is a value of 1. For example, an (N, j, k) LDPC code is a linear block code having a block length N, and is defined by a sparse parity check matrix in which each column has j elements having a value of 1, each row has k elements having a value of 1, and all of the elements except for the elements having the value of 1 have a value of 0.

An LDPC code in which a weight of each column in the parity check matrix is fixed to 'j' and a weight of each row in the parity check matrix is fixed to 'k' as stated above, is called a "regular LDPC code." Herein, the "weight" refers to the number of elements having a non-zero value among the elements constituting the generating matrix and parity check matrix. On the contrary, an LDPC code in which the weight of each column in the parity check matrix and the weight of each row in the parity check matrix are not fixed is called an "irregular LDPC code."

It is generally known that the irregular LDPC code is superior in performance to the regular LDPC code. However, in the case of the irregular LDPC code, because the weight of each column and the weight of each row in the parity check matrix are not fixed, i.e. are irregular, the weight of each column in the parity check matrix and the weight of each row in the parity check matrix must be properly adjusted in order to guarantee the excellent performance.

With reference to FIG. 1, a description will now be made of a parity check matrix of an (8, 2, 4) LDPC code as an example of the (N, j, k) LDPC code.

FIG. 1 is a diagram illustrating a parity check matrix of a general (8, 2, 4) LDPC code.

Referring to FIG. 1, a parity check matrix H of the (8, 2, 4) LDPC code is comprised of 8 columns and 4 rows, wherein a weight of each column is fixed to 2 and a weight of each row is fixed to 4. Because the weight of each column and the weight of each row in the parity check matrix are regular, the (8, 2, 4) LDPC code illustrated in FIG. 1 is a regular LDPC code.

The parity check matrix of the (8, 2, 4) LDPC code has been described so far with reference to FIG. 1. Next, a factor graph of the (8, 2, 4) LDPC code described in connection with FIG. 1 will be described hereinbelow with reference to FIG. 2.

FIG. 2 is a diagram illustrating a factor graph of the (8, 2, 4) LDPC code of FIG. 1.

Referring to FIG. 2, a factor graph of the (8, 2, 4) LDPC code is comprised of 8 variable nodes of $x_1$ 202, $x_2$ 204, $x_3$ 206, $x_4$ 208, $x_5$ 210, $x_6$ 212, $x_7$ 214 and $x_8$ 216, and 4 check nodes 218, 220, 222 and 224. When an element having a value of 1, i.e. a non-zero value, exists at the point where an $i^{th}$ row and a $j^{th}$ column of the parity check matrix of the (8, 2, 4) LDPC code cross each other, a branch is created between a variable node $x_i$ and a $j^{th}$ check node.

Because the parity check matrix of the LDPC code has a very small weight as described above, it is possible to perform decoding through iterative decoding even in a block code having a relatively long size, that exhibits performance approximating a channel capacity limit of Shannon's channel coding theorem, such as a turbo code, while continuously increasing a block size of the block code. MacKay and Neal have proven that an iterative decoding process of an LDPC code using a flow transfer scheme approximates an iterative decoding process of a turbo code in performance.

In order to generate a high-performance LDPC code, the following conditions should be satisfied.

(1) Cycles in a Factor Graph of an LDPC Code Should Be Considered.

The term "cycle" refers to a loop formed by the edges connecting the variable nodes to the check nodes in a factor graph of an LDPC code, and a length of the cycle is defined as the number of edges constituting the loop. A long cycle means that the number of edges connecting the variable nodes to the check nodes constituting the loop in the factor graph of the LDPC code is large. In contrast, a short cycle means that the number of edges connecting the variable nodes to the check nodes constituting the loop in the factor graph of the LDPC code is small.

As cycles in the factor graph of the LDPC code become longer, the performance efficiency of the LDPC code increases, for the following reasons. When long cycles are generated in the factor graph of the LDPC code, it is possible to prevent performance degradation such as an error floor occurring when too many cycles with a short length exist in the factor graph of the LDPC code.

(2) Efficient Coding of an LDPC Code Should Be Considered.

It is difficult for the LDPC code to undergo real-time coding compared with a convolutional code or a turbo code because of its high coding complexity. In order to reduce the coding complexity of the LDPC code, a Repeat Accumulate (RA) code has been proposed. However, the RA code also has a limitation in reducing the coding complexity of the LDPC code. Therefore, efficient coding of the LDPC code should be taken into consideration.

(3) Degree Distribution in a Factor Graph of an LDPC Code Should Be Considered.

Generally, an irregular LDPC code is superior in performance to a regular LDPC code, because a factor graph of the irregular LDPC code has various degrees. The term "degree" refers to the number of edges connected to the variable nodes and the check nodes in the factor graph of the LDPC code. Further, the phrase "degree distribution" in a factor graph of an LDPC code refers to a ratio of the number of nodes having a particular degree to the total number of nodes. It has been proven by Richardson that an LDPC code having a particular degree distribution is superior in performance.

However, a detailed scheme of performing channel interleaving/deinterleaving taking characteristics of the LDPC code into account in the communication system using the LDPC code has never been considered. Accordingly, there is a need for a detailed scheme of performing channel interleaving/deinterleaving taking characteristics of the LDPC code into account in the communication system using the LDPC code.

Generally, the LDPC code is expressed using a parity check matrix. Up to date, the research on the LDPC code has been based on Binary Phase Shift Keying (BPSK) and Quadrature Phase Shift Keying (QPSK) modulations. However, in the next generation mobile communication system requiring a high data rate, there is a need for research on the LDPC code suitable for high-order modulation such as 16-ary Quadrature Amplitude Modulation (16QAM) and 64QAM in order to use the LDPC code.

SUMMARY OF THE INVENTION

It is, therefore, an object of the present invention to provide a channel interleaving/deinterleaving apparatus in a communication system using an LDPC code, and a control method thereof.

It is another object of the present invention to provide an apparatus and method for performing channel interleaving/deinterleaving according to a performance difference between a high-protected initial message and a low-protected initial message being input to an LDPC code.

It is further another object of the present invention to provide an apparatus and method for performing channel interleaving/deinterleaving according to a degree of check nodes of an LDPC code.

According to one aspect of the present invention, there is provided a channel interleaving method in a communication system using a low density parity check (LDPC) code. The method includes encoding information data bits into an LDPC codeword using a predetermined coding scheme upon receipt of the information data bits; interleaving the LDPC codeword according to a predetermined channel interleaving rule; and modulating the channel-interleaved LDPC codeword into a modulation symbol using a predetermined modulation scheme.

According to another aspect of the present invention, there is provided a channel deinterleaving method in a communication system using a low density parity check (LDPC) code. The method includes demodulating a received signal using a demodulation scheme corresponding to a modulation scheme used for channel interleaving; deinterleaving the demodulated signal using a channel deinterleaving scheme corresponding to a channel interleaving rule used for the channel interleaving; and decoding the channel-deinterleaved signal into information data bits using a decoding scheme corresponding to an LDPC codeword coding scheme used for the channel interleaving.

According to a further aspect of the present invention, there is provided a channel interleaving method in a communication system using a low density parity check (LDPC) code. The method includes determining a degree of a check node from a parity check matrix of an LDPC code; if the degree of the check node is lower than a threshold set in the system, channel-interleaving the LDPC code according to a first channel interleaving rule; and if the degree of the check node is higher than or equal to the threshold set in the system, channel-interleaving the LDPC code according to a second channel interleaving rule.

According to yet another aspect of the present invention, there is provided a channel interleaving apparatus in a communication system using a low density parity check (LDPC) code. The apparatus includes an encoder for encoding information data bits into an LDPC codeword using a predetermined coding scheme upon receipt of the information data bits; a channel interleaver for interleaving the LDPC codeword according to a predetermined channel interleaving rule; and a modulator for modulating the channel-interleaved LDPC codeword into a modulation symbol using a predetermined modulation scheme.

According to still another aspect of the present invention, there is provided a channel deinterleaving apparatus in a communication system using a low density parity check (LDPC) code. The apparatus includes a demodulator for demodulating a received signal using a demodulation scheme corresponding to a modulation scheme used in a channel interleaver; a channel deinterleaver for deinterleaving the demodulated signal using a channel deinterleaving scheme corresponding to a channel interleaving rule used in a channel interleaver; and a decoder for decoding the channel-deinterleaved signal into information data bits using a decoding scheme corresponding to an LDPC codeword coding scheme used in the channel interleaver.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF PREFERRED EMBODIMENTS

Preferred embodiments of the present invention will now be described in detail with reference to the annexed drawings.

In the following description, a detailed description of known functions and configurations incorporated herein has been omitted for clarity and conciseness.

Before a detailed description of the present invention is given, it should be noted that interleaving/deinterleaving of a Low Density Parity Check (LDPC) code is generally performed using the general interleaver/deinterleaver regardless of the characteristic and structure of the LDPC code. On the contrary, the present invention designs a channel interleaver/deinterleaver taking the characteristic and structure of the LDPC code into account. That is, the present invention provides a plan to design a channel interleaver according to a performance difference between a high-protected initial message (initial message protected at a high protection rate) and a low-protected initial message (initial message protected at a low protection rate) being input to the LDPC code, and a degree of check nodes of the LDPC code.

The present invention provides a channel interleaving/deinterleaving apparatus in a communication system using an LDPC code, and a control method thereof. In particular, the present invention provides a plan to design a channel interleaving/deinterleaving apparatus that maximizes coding performance when mapping LDPC codewords to high-order modulation symbols.

The high-order modulation, for example, 16QAM and 64QAM, shows a feature of unequal error protection according to bit position when bits are mapped to a symbol. For example, when 4 bits form one symbol in 16QAM, the bits mapped to two positions show a high error protection feature and the bits mapped to the other positions show a low error protection feature. In addition, an irregular LDPC code differs in error correction capability between variable nodes having different degrees. Therefore, it is possible to improve performance of the LDPC code by appropriately mapping the unequally protected bits, being input to the irregular LDPC code, to the variable nodes having different error correction capabilities.

As described above, the present invention relates to the LDPC code, which is an error correction code. In particular, the present invention provides a plan to design a channel interleaving/deinterleaving apparatus for increasing an error correction capability in the communication system using the LDPC code.

Figures 1, 2:
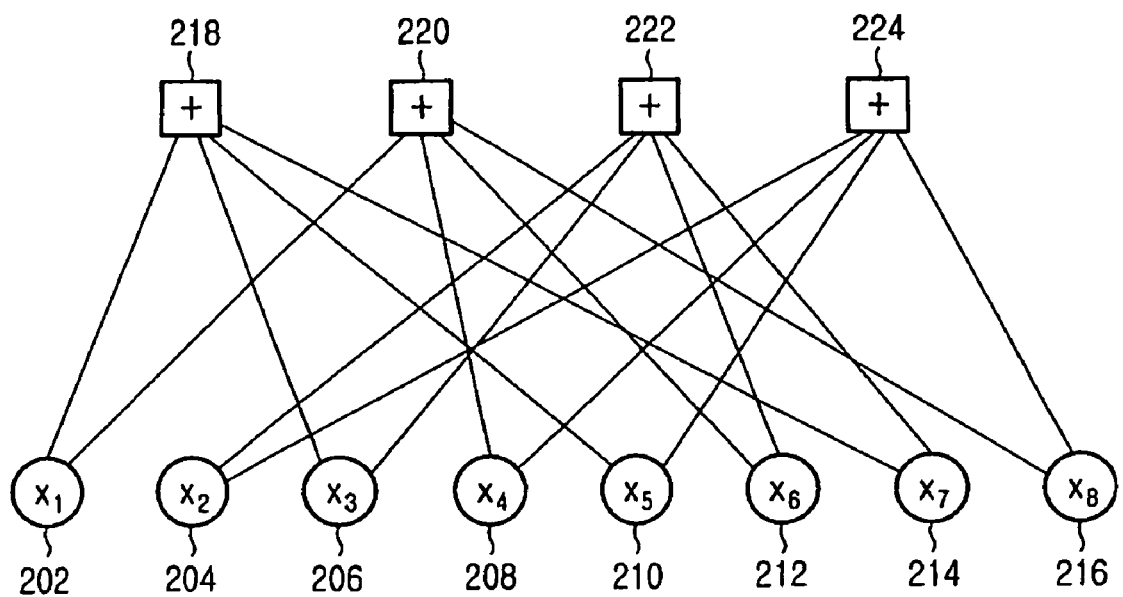
FIG. 1 is a diagram illustrating a parity check matrix of a general (8, 2, 4) LDPC code.
FIG. 2 is a diagram illustrating a factor graph of the (8, 2, 4) LDPC code of FIG. 1.
Figure 3:
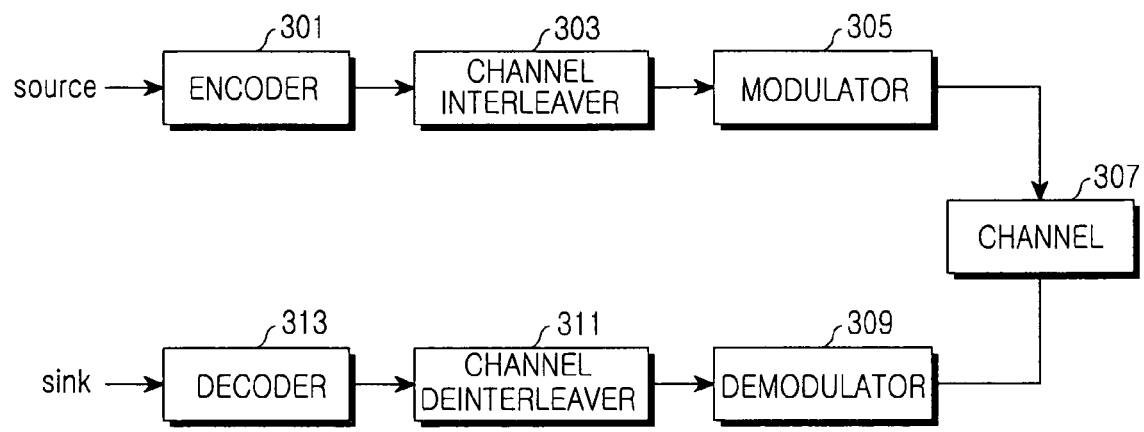
FIG. 3 is a diagram schematically illustrating a configuration of a communication system using an LDPC code according to the present invention.

FIG. 3 shows a configuration of a communication system using an LDPC code according to the present invention.

The communication system is composed of a transmitter and a receiver. The transmitter includes an encoder 301, a channel interleaver 303, and a modulator 305, and the receiver includes a demodulator 309, a channel deinterleaver 311, and a decoder 313.

If information data bits are received, the information data bits are provided to the encoder 301. The encoder 301 encodes the input information data bits into a codeword according to a predetermined coding scheme, and outputs the codeword to the channel interleaver 303. Herein, the encoder 301 is an LDPC encoder, so the codeword output from the encoder 301 is an LDPC codeword.

The channel interleaver 303 interleaves the LDPC codeword output from the encoder 301 according to a predetermined channel interleaving scheme, and outputs the interleaved LDPC codeword to the modulator 305. The channel interleaver 303 interleaves the LDPC codeword output from the encoder 301 using the channel interleaving scheme in order to prevent burst errors due to fading. The channel interleaving operation of the channel interleaver 303 is performed according to a 'channel interleaver design rule' according to the present invention, and this will be described in detail below.

The modulator 305 modulates the signal output from the channel interleaver 303, i.e. the channel-interleaved LDPC codeword, using a predetermined modulation scheme, and transmits the modulated signal over a channel 307 via a transmission antenna. The channel interleaver 303 performs channel interleaving such that the modulator 305 may allocate the channel-interleaved LDPC codeword to a modulation symbol so as to minimize an error rate when modulating the channel-interleaved LDPC codeword using the modulation scheme. That is, the channel interleaver 303 is designed according to a performance difference between a high-protected initial message and a low-protected initial message, and a degree of check nodes of the LDPC code, using the characteristic that each bit of the LDPC codeword has a different reliability.

The signal transmitted by the transmitter is transmitted over the channel 307. The signal transmitted over the channel 307 by the transmitter is received via a reception antenna, and the received signal is provided to the demodulator 309. The demodulator 309 demodulates the received signal using a demodulation scheme corresponding to the modulation scheme used in the modulator 305 of the transmitter, and outputs the demodulated signal to the channel deinterleaver 311.

The channel deinterleaver 311 deinterleaves the signal output from the demodulator 309 using a channel deinterleaving scheme corresponding to the channel interleaving scheme used in the channel interleaver 303 of the transmitter, and outputs the deinterleaved signal to the decoder 313. The channel deinterleaving operation of the channel deinterleaver 311 is also performed according to the 'channel interleaver design rule' of the present invention, and this will be described in detail below.

The decoder 313 decodes the deinterleaved signal using a decoding scheme corresponding to the coding scheme used in the encoder 301 of the transmitter, thereby restoring the final information data bits.

Although a transmission part for radio frequency (RF) signal processing, positioned after the modulator 305, and a reception part for RF signal processing, positioned before the demodulator 309, are not shown in FIG. 3, it would be obvious to those skilled in the art that the signal output from the modulator 305 is RF-processed through the transmitter before being transmitted, and the received signal is RF-processed through the receiver and is provided to the demodulator 309.

Figure 4:
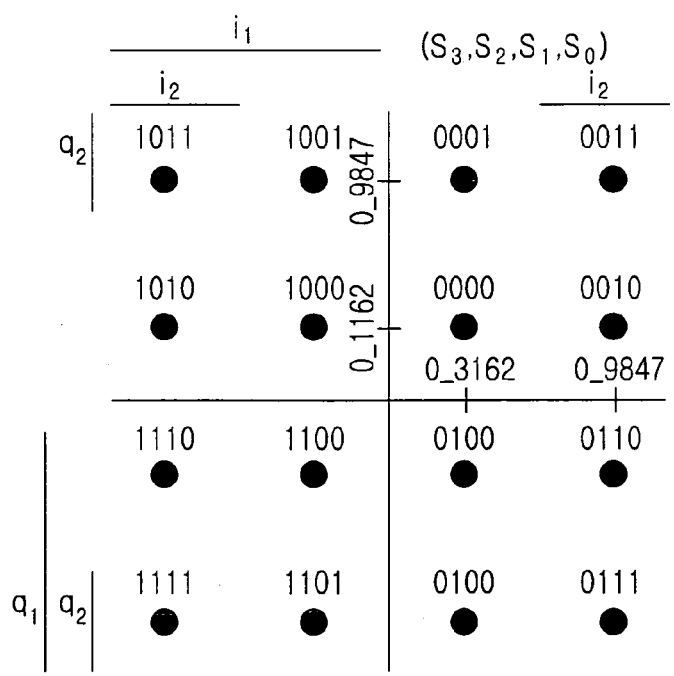
FIG. 4 is a diagram schematically illustrating a general 16QAM constellation.

FIG. 4 is a diagram illustrating a general 16QAM constellation, where bits ($S_3,S_2,S_1,S_0$) mapped to one modulation symbol have different reliabilities. In FIG. 4, $i_1$ and $i_2$ having real values correspond to the bits $S_3$ and $S_1$ in the modulation symbol. Herein, the bit $S_3$ is mapped such that it has a value of 0 and 1 symmetrically along the y-axis, which is the imaginary axis. However, the bit $S_1$ is mapped such that an area close to the y-axis has a value of 0 and an area far from the y-axis has a value of 1, so the probability that the receiver will decide 0 as 1 is higher than the probability that the receiver will decide 1 as 0. Due to the asymmetricity, a value mapped to the bit $S_1$ has a high error probability, decreasing the reliability.

In addition, $q_1$ and $q_2$ having imaginary values correspond to the bits $S_2$ and $S_0$ in the modulation symbol. Similarly, of the bits $S_2$ and $S_0$, the bit $S_2$ is higher in reliability than the bit $S_0$.

The present invention designs the channel interleaver using the unequal error characteristics of the high-order modulation, described above.

The LDPC code can be decoded using a sum-product algorithm-based iterative decoding algorithm in the factor graph. That is, the decoding is performed in such a manner that a variable node and a check node exchange messages with each other. In every step, the variable node determines a bit mapped thereto as 1 or 0 based on the message received from the channel and the message received from the check node.

The unequal error protection feature due to the use of the high-order modulation can be used as follows.

(1) The high-protected bits (bits protected at a high protection rate) are allocated to information nodes among the variable nodes, thereby increasing a reliability of the message received from the channel in the process of determining the information bit as one or zero.

(2) The high-protected bits can be used by the check node in increasing a reliability of the message delivered to the variable node mapped to the information bit.

The present invention provides a plan to design a channel interleaver using one of the above features (1) or (2) according to the structure of the LDPC code. The structure of the LDPC code is determined depending on a degree of the variable node and a degree of the check node. In determining channel interleaver design rules, the present invention designs the channel interleaver of the LDPC code taking the decree of the check node into account, and the design rules are as follows.

Channel Interleaver Design Rules

First Rule (degree of check node<threshold): The codeword bits mapped to the lower-reliability variable nodes, i.e. a lower-degree variable nodes, are allocated to the higher-reliability bits, for example, $S_3$ and $S_2$ in FIG. 4, among bits in the modulation symbol. The bits are allocated to a predetermined number of high-protected bit positions (bit positions having a high error protection rate) in ascending order of the degree.

Second Rule (degree of check node≧threshold): The codeword bits mapped to the higher-degree variable nodes, i.e. information word bits, are allocated to the higher-reliability bits, for example, $S_3$ and $S_2$ in FIG. 4, among the bits in the modulation symbol. Herein, the bits are allocated to a predetermined number of high-protected bit positions in a descending order of the degree.

Third Rule: For the LDPC code in which low-degree variable nodes, for example, variable nodes mapped to the parity bits are connected in a chain-like fashion, the distance between the parity bits mapped to the high-reliability bits remains constant if possible. In the third rule, the features of the first or second rule should be maintained.

In the channel interleaver design rules defined above, the threshold is determined depending on a performance difference between unequally protected bits (bits protected at different error protection rates). In the following description, the threshold is assumed as five.

Figure 5A:
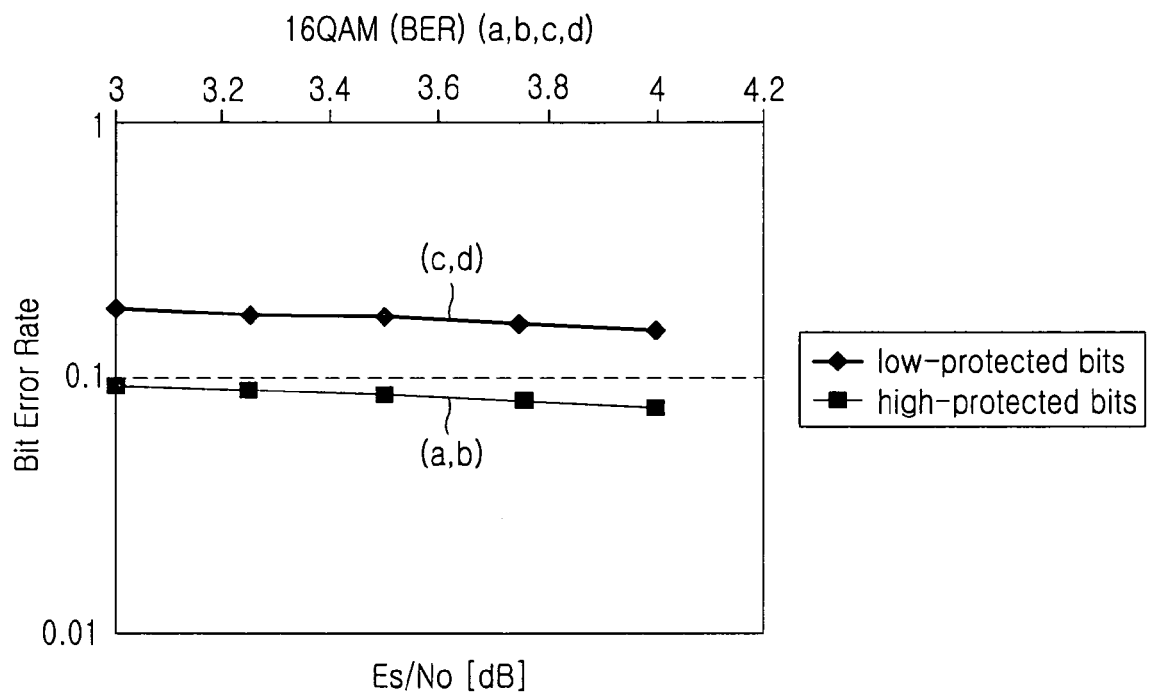
FIGS. 5A and 5B are diagrams illustrating exemplary bit error rate (BER) graphs for a description of a performance difference between unequally protected bits according to the present invention.
Figure 5B:
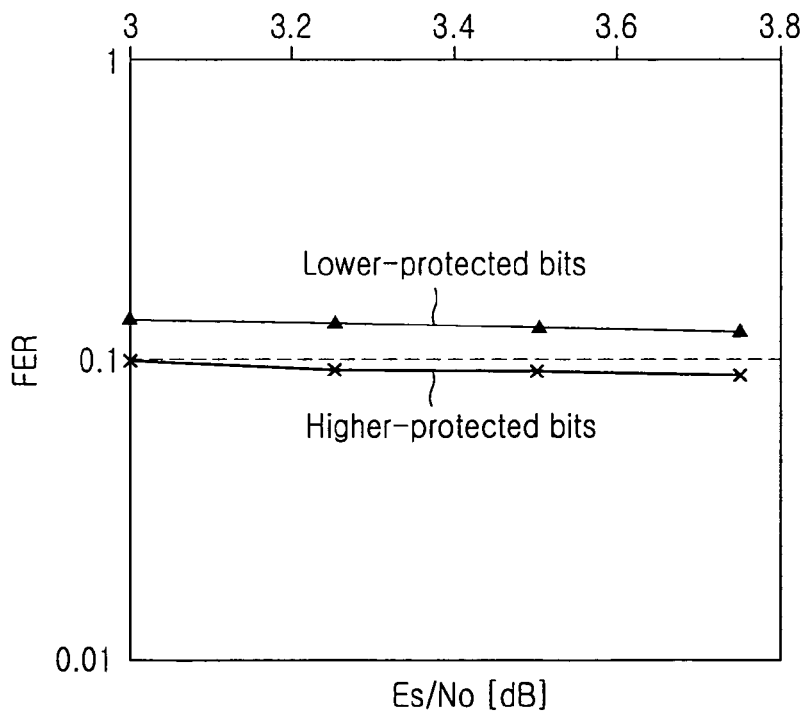

FIGS. 5A and 5B are diagrams illustrating exemplary bit error rate (BER) graphs for a description of a performance difference between unequally protected bits according to the present invention.

FIG. 5A illustrates a BER graph for a system using 16QAM modulation and an LDPC code. FIG. 5B illustrates a BER graph for a system using a Chase Combining technique for applying the 16QAM modulation and the LDPC code to a Hybrid Automatic Repeat Request (HARQ) system, in which second retransmission is performed.

Before a description of FIGS. 5A and 5B is given, it should be noted that the present invention determines the threshold using the experimental result and the density evolution analysis, and it is preferable to implement the threshold indicating the optimal performance according to the system conditions. The method of determining the threshold indicating the optimal performance using the density evolution analysis is not directly related to the gist of the present invention, so a detailed description thereof will be omitted herein.

It can be noted from FIGS. 5A and 5B that as the performance difference between the unequally protected bits is smaller, the threshold increases. That is, it can be understood that the threshold in FIG. 5B is higher than the threshold in FIG. 5A. In other words, it can be noted in FIG. 5B that the BER difference between the high-protected bits and the low-protected bits (bits protected at a low protection rate) is reduced. This is for the following reasons.

When the performance difference between the unequally protected bits is small, the error correction can be achieved depending on the messages provided from the check nodes, even though the low-protected bits are allocated to the information bits, for example, to the high-degree variable nodes. In other words, this corresponds to the use of the feature (2) for the unequally protected bits.

However, an increase in the performance difference between the unequally protected bits makes it impossible to correct an error depending the message provided from the check node when the low-protected bits are allocated to the information bits. In this case, therefore, the high-protected bits should be allocated to the information bits. In other words, this corresponds to the use of the feature (1) for the unequally protected bits.

The channel interleaver according to the present invention is designed based on the following theory.

In the process of decoding the LDPC code using the sum-product algorithm, the variable node mapped to the information bit determines 1 or 0 depending on all the messages received from the check node and the message received from the channel. Calculation of the check node in the sum-product algorithm will be summarized below.

A size of the message delivered from the check node to the variable node can be approximated to the smallest value among the messages input to the check node, and a sign of the message is determined by the product of signs of the input messages. If the degree of the check node is low, as the probability that a sign of the message delivered to the variable node will be correct is higher and the degree is higher, the probability that the sign of the message will be correct is lower. That is, as the degree of the check node is higher, the size of the delivered message is smaller, and as the degree of the check node is higher, the reliability of the delivered message is lower.

Based on the foregoing description, a detailed description will now be made of the channel interleaver design rules according to the present invention.

In the first rule, because the degree of the check node is lower than the threshold, a reliability of the message delivered from the check node to the variable node is high. Therefore, there is a high probability that the variable node mapped to the information bit will determine 1 or 0 depending on the message delivered from the check node. In this case, therefore, in order to improve performance of the LDPC code, it is preferable to use the features of the unequally protected bits based on the high-order modulation in such a manner that a reliability of the message delivered from the check node to the variable node may increase higher.

To this end, it is necessary to increase the reliability of the lowest-reliability message among the messages input to the check node. That is, it is necessary to increase the size of the message delivered from the low-degree variable node to the check node. Therefore, the high-protected bits are mapped to the low-degree variable node according to the first rule of the present invention.

In the second rule, because the degree of the check node is higher than or equal to the threshold, there is a low probability that the message delivered from the check node to the variable node will be correct. In this case, therefore, when the variable node mapped to the information bit determines 1 or 0, reliabilities of the messages delivered from the check node decrease. Therefore, in order to decrease a BER of the information bit, it is preferable to use the features of the unequally protected bits based on the high-order modulation in such a manner that a reliability of the message delivered from the channel may increase higher. Therefore, the information bits, for example, the codeword bits mapped to the high-degree variable node should be allocated to the high-reliability bits according to the second rule of the present invention.

The third rule is applied to the LDPC code with a chain structure. That is, for the chain-structured LDPC code, degree=2 variable nodes mapped to the parity bits are adjacent to each other in the receiving order. The chain-structured LDPC code will now be described with reference to FIG. 6.

Figure 6:
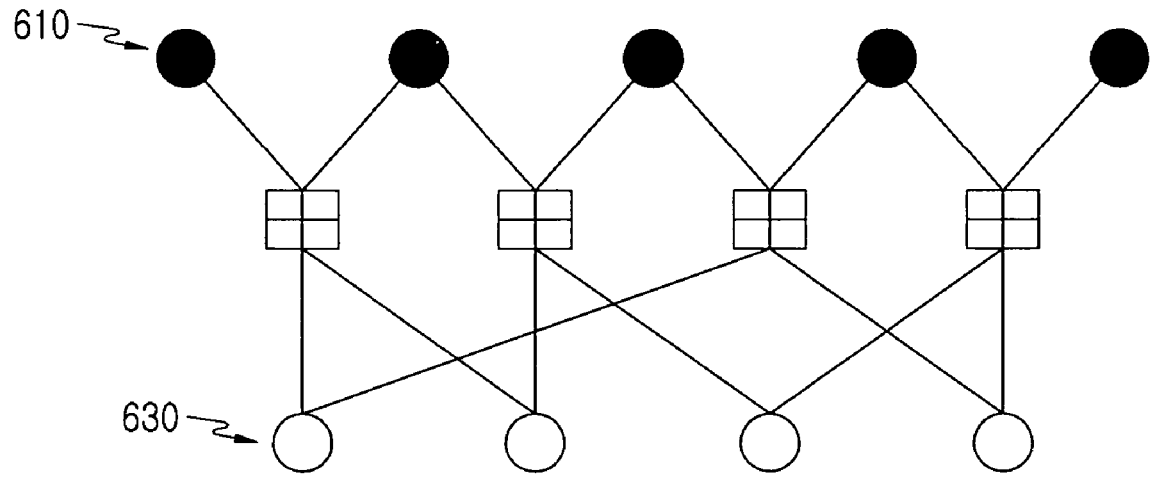
FIG. 6 is a diagram illustrating an exemplary chain-structured LDPC code for a description of the present invention.

FIG. 6 is a diagram illustrating an exemplary chain-structured LDPC code for a description of an embodiment of the present invention.

Referring to FIG. 6, black circles 610 represent variable nodes mapped to the parity bits, and white circles 630 represent variable nodes mapped to the information bits. As illustrated, because the number of lines (or edges) connected to each of the variable nodes mapped to the parity bits represented by reference numeral 610 is 2, the LDPC code of FIG. 6 has degree=2 variable nodes. It can be noted that the lines connected from the variable nodes mapped to the parity bits represented by reference numeral 610 are sequentially connected in their received order. This LDPC code is called a chain-structured LDPC code.

In the chain-structured LDPC code, the high-protected bits and the low-protected bits should be uniformly distributed in order to improve performance of the sum-product algorithm-based LDPC code. The same is also applied to a method of determining a puncturing pattern. Therefore, the LDPC code should be structured such that the distance between the high protected bits and the low protected bits may remain equal according to the third rule of the present invention.

Figure 7A:
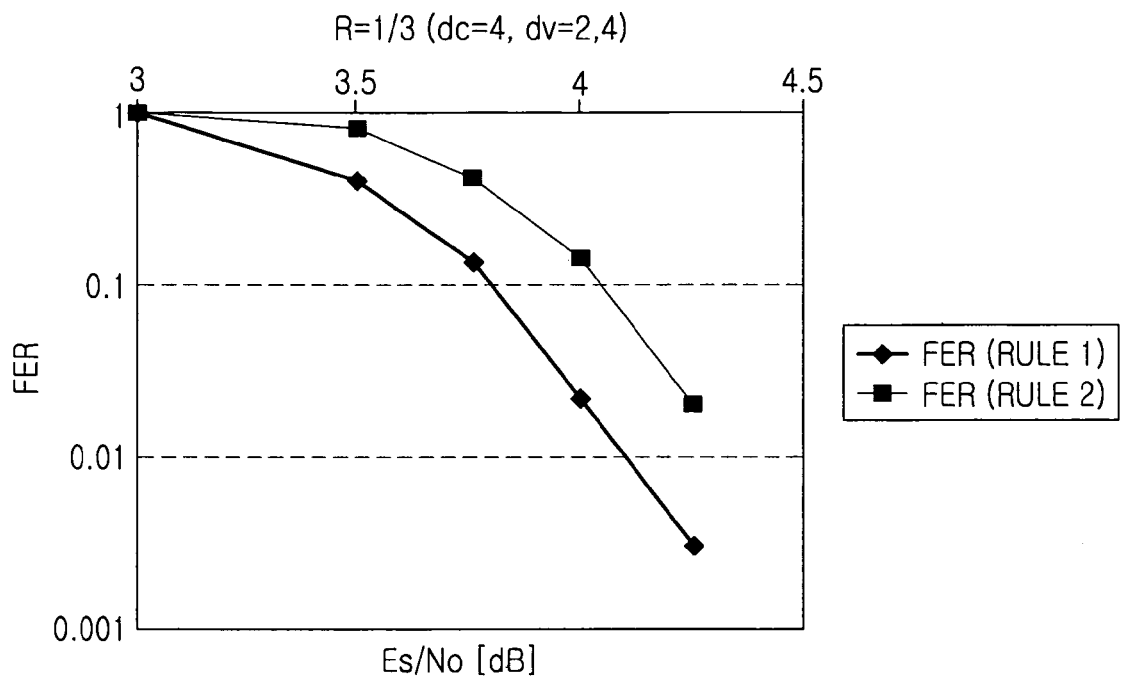
FIGS. 7A and 7B show performance graphs of an irregular LDPC code with 1152 code bits and a code rate R=1/3.
Figure 7B:
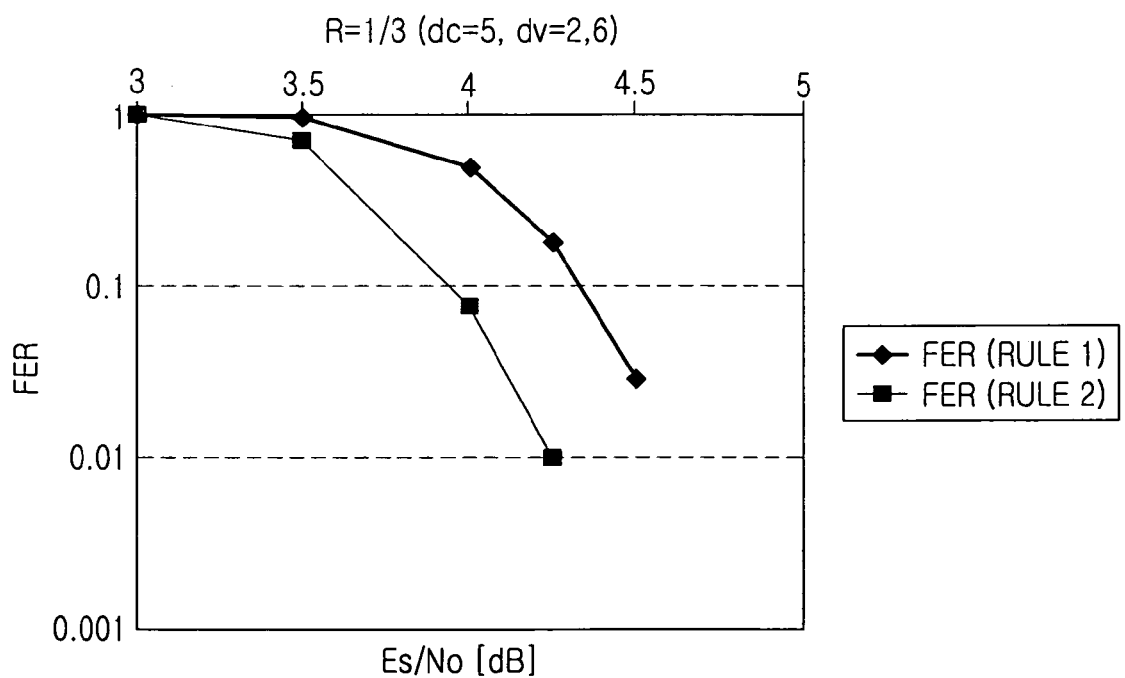

FIGS. 7A and 7B are diagrams illustrating performance graphs of an LDPC code generated based on a channel interleaver design rule according to an embodiment of the present invention.

FIGS. 7A and 7B show performance graphs of an irregular LDPC code with 1152 code bits and a code rate R=⅓. In FIGS. 7A and 7B, 'dc' denotes a degree of a check node, and 'dv' denotes a degree of a variable node. FIG. 7A shows an irregular LDPC code with dc=4 and dv=2,4, and FIG. 7B shows an irregular LDPC code with dc=5 and dv=2,6.

It can be understood that the irregular LDPC codes shown in FIGS. 7A and 7B have the same code rate R=⅓, but have different channel interleaver design rules applied thereto. The code shown in FIG. 7A, as its check node degree is lower than the threshold, for example, five set in the system, shows higher performance when the first rule of the channel interleaver design rules is applied thereto. The code shown in FIG. 7B, as its check node degree is higher than or equal to the threshold five, shows higher performance when the second rule of the channel interleaver design rules is applied thereto.

Figure 8A:
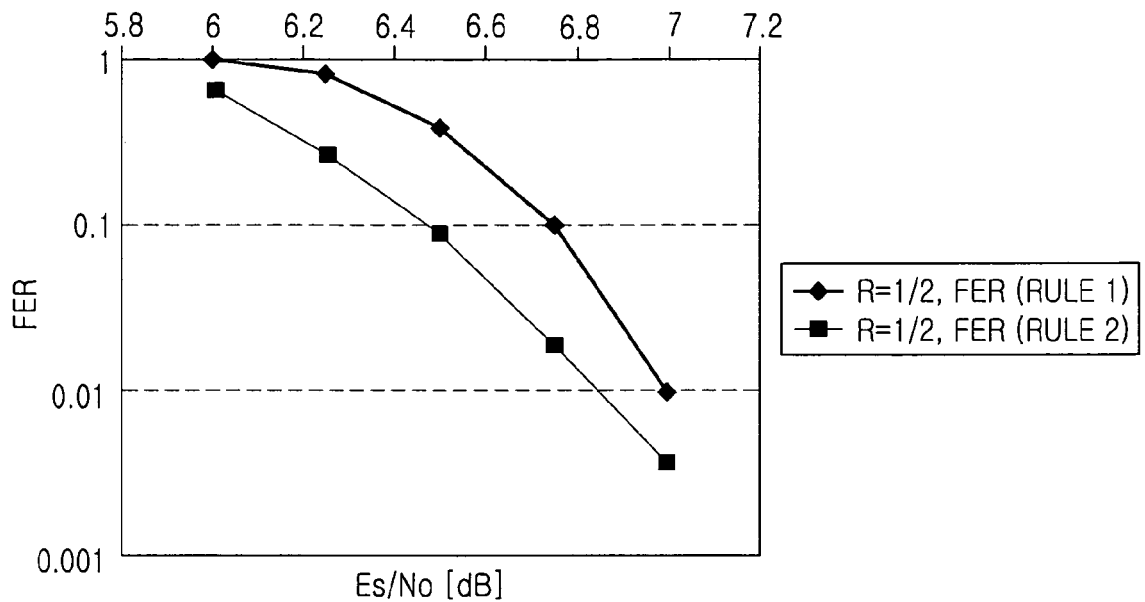
FIGS. 8A and 8B show performance graphs of an irregular LDPC code with 200 information bits and a code rate R=1/2, and an irregular LDPC code with 200 information bits and a code rate R=1/6, respectively.
Figure 8B:
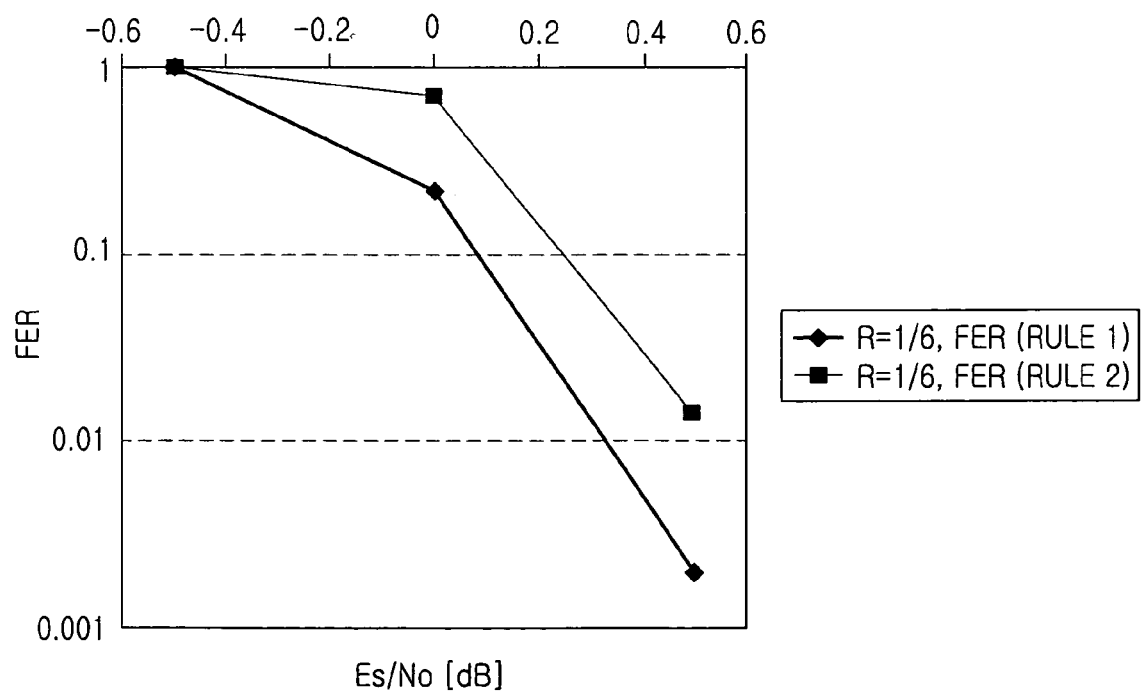

FIGS. 8A and 8B are diagrams illustrating other performance graphs of an LDPC code generated based on a channel interleaver design rule according to an embodiment of the present invention.

FIGS. 8A and 8B show performance graphs of an irregular LDPC code with 200 information bits and a code rate R=½, and an irregular LDPC code with 200 information bits and a code rate R=⅙, respectively. For the LDPC codes, dv=2, 3 and 7 in both FIGS. 8A and 8B, dc=7 in FIG. 8A, and dc=3 in FIG. 8B.

It can be noted from FIGS. 8A and 8B that the performance of the irregular LDPC codes, even though they have different code rates of ½ and ⅙, can show high performance if the channel interleaver design rules according to the present invention are applied thereto. That is, it is noted that the code shown in FIG. 8A, as its check node degree is higher than the threshold five, shows higher performance when the second rule of the channel interleaver design rules is applied thereto. It is also noted that the code shown in FIG. 8B, as its check node degree is lower than the threshold five, shows higher performance when the first rule of the channel interleaver design rules is applied thereto.

Figure 9:
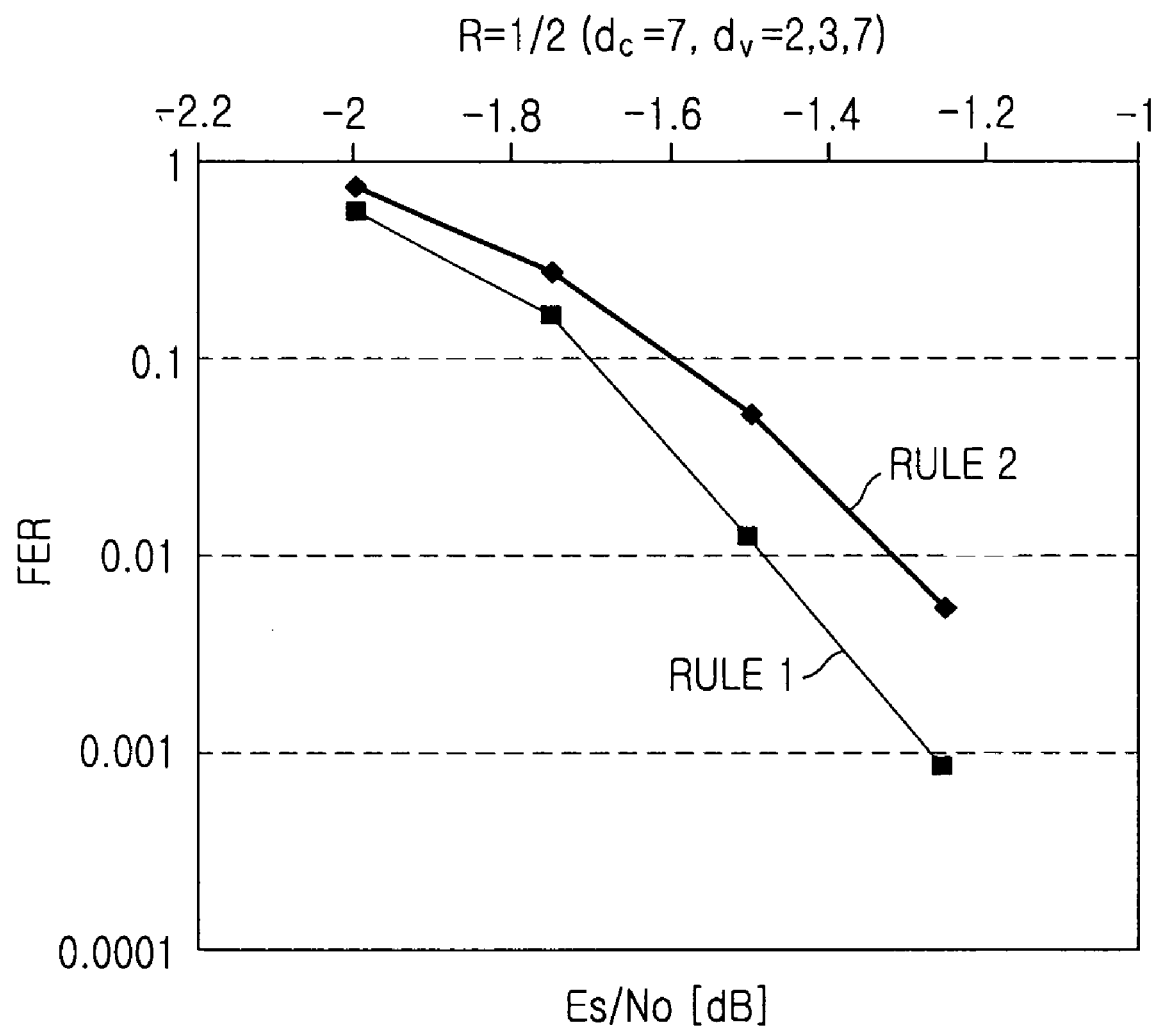
FIG. 9 is a performance graph of a system in which a Chase Combining technique is used for a channel interleaver design rule according to the present invention.

FIG. 9 is a performance graph of a system in which a Chase Combining technique is used for a channel interleaver design rule according to an embodiment of the present invention.

FIG. 9 shows a performance graph of the system using the Chase Combining technique of a high-order modulation scheme. For example, the LDPC code shown in FIG. 9 has dv=2, 3 and 7, and dc=7.

On the contrary, it can be noted in FIG. 9 that the LDPC code, even though its check node degree is higher than the threshold five, shows higher performance when the first rule of the channel interleaver design rule is applied thereto. In this case, the threshold for the channel interleaver design is set higher than the threshold shown in FIGS. 7A to 8B.

Compared with FIGS. 7A to 8B in which the threshold is five, FIG. 9 has a higher threshold as the system uses the Chase Combining. In other words, the LDPC code of FIG. 9, even though its check node degree is higher than five, shows higher performance when the first rule of the present invention is used therefor. As stated above, the threshold can be higher than the threshold five of FIGS. 7A to 8B. For example, the code of FIG. 9 has dc=7. It can note appreciated from FIG. 9 that for the Chase Combining, it is preferable to create the LDPC code based on the first rule. In this case, the threshold can be higher than seven.

Therefore, the optimal threshold of FIG. 9 is variable according to system conditions. Accordingly, it is possible to apply a different threshold to every system.

From FIGS. 7A to 9, it can be appreciated that the channel interleaver design rules according to the present invention are suitable for actual implementation.

Figure 10:
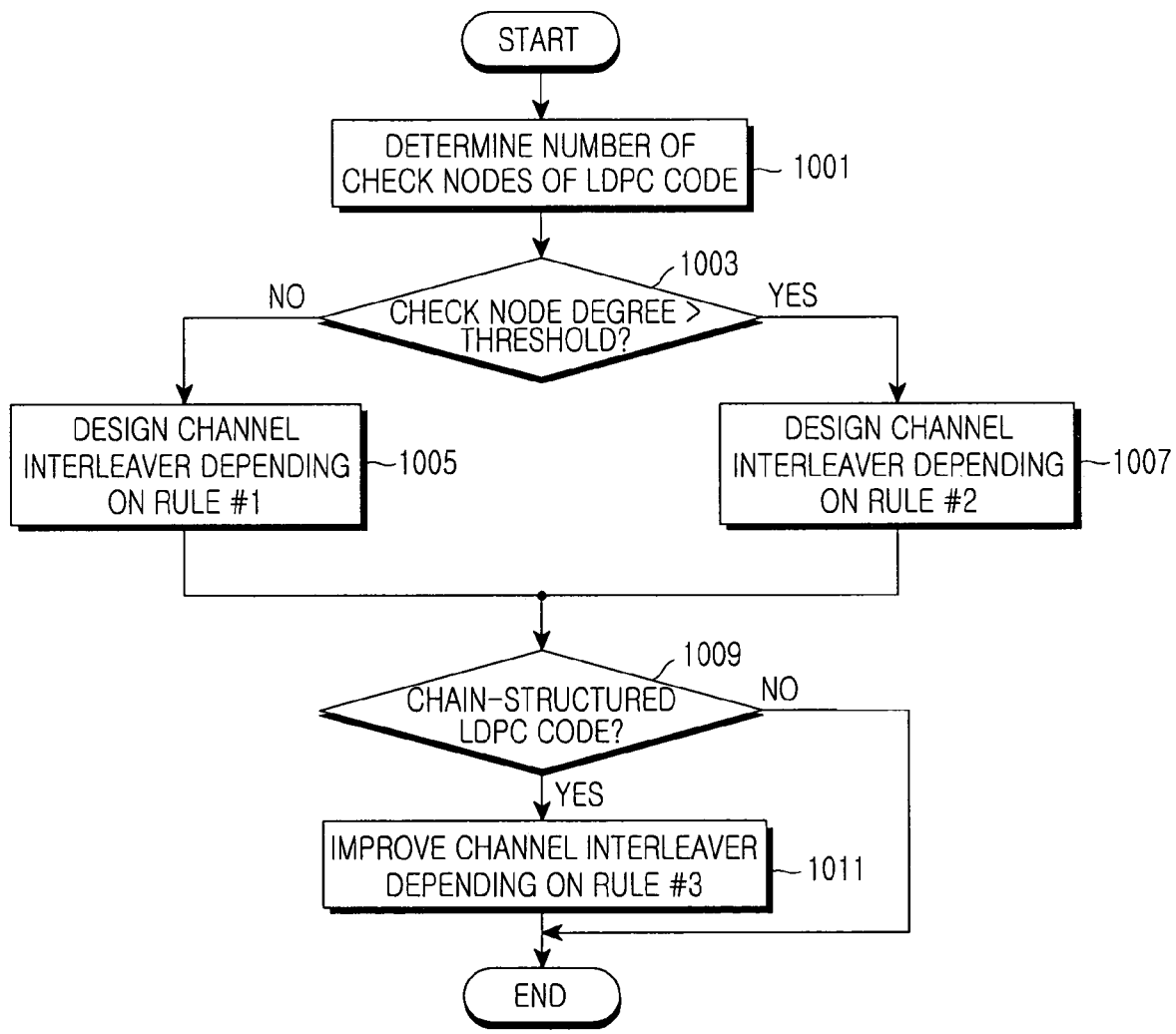
FIG. 10 is a flowchart schematically illustrating a method for applying a channel interleaver design rule according to the present invention.

FIG. 10 is a flowchart illustrating a method for applying a channel interleaver design rule according to the present invention.

In step 1001, the method determines the number of check nodes having a value '1' from a parity check matrix of an LDPC code, i.e. determines the number of '1's in a row of the parity check matrix. In step 1003, the method compares the number of the check nodes having a value '1' with a threshold set in the system, and proceeds to one of step 1005 or step 1007 according to the result. If the number of the check nodes having a value '1' is less than the threshold as a result of the comparison, the method proceeds to step 1005. However, if the number of the check nodes having a value '1' is greater than or equal to the threshold, the method proceeds to step 1007.

In step 1005, as the number of the check nodes having a value '1' is less than the threshold, the method designs a channel interleaver depending on the first rule of the channel interleaver design rules according to the present invention. In step 1007, as the number of the check nodes having a value '1' is greater than or equal to the threshold, the method designs a channel interleaver depending on the second rule of the channel interleaver design rules according to the present invention.

After designing the channel interleaver in step 1005 or step 1007, the method determines in step 1009 whether the corresponding LDPC code is a chain-structured LDPC code. If it is determined in step 1009 that the LDPC code is a chain-structured LDPC code, the method improves the channel interleaver depending on the third rule of the channel interleaver design rules according to the present invention in step 1011. However, if the LDPC code is not the chain-structured LDPC code in step 1009, the method uses the channel interleaver designed in step 1005 or step 1007.

In sum, the method determines the number of check nodes having a value '1' from a parity check matrix of an LDPC code to be used, i.e. determines the number of '1's in a row of the parity check matrix. The method compares the number of the check nodes having a value '1' with a threshold set in the system. It is assumed herein that the threshold is five. If the number of the check nodes having a value '1' is less than the threshold five, the method constructs a channel interleaver depending on a first channel interleaver design rule. If the number of the check nodes having a value '1' is greater than or equal to the threshold five, the method constructs a channel interleaver depending on a second channel interleaver design rule. If the LDPC code is a chain-structured LDPC code in which its parity bits are chain-connected, the method constructs the channel interleaver using a third channel interleaver design rule.

As can be appreciated from the foregoing description, the communication system using an LDPC code according to the present invention performs channel interleaving taking the unequal reliability characteristics into account, thereby improving a reliability of the LDPC code. In particular, through the channel interleaving, the present invention can improve reliabilities of low-reliability bits among the bits constituting the LDPC code. As a result, the LDPC code is robust against the wireless channel environment having a high burst error probability, like the fading channel. Transmission/reception of the reliable LDPC code reduces the overall system error rate, facilitating high-speed reliable communication.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A channel interleaving method in a communication system using a low density parity check (LDPC) code, the method comprising:
    encoding information data bits into an LDPC codeword using a predetermined coding scheme upon receipt of the information bits;
    interleaving the LDPC codeword according to a predetermined channel interleaving rule; and modulating the channel-interleaved LDPC codeword into a modulation symbol using a predetermined modulation scheme, wherein the channel interleaving rule is defined such that if a degree of a check node is lower than a threshold set in the system, codeword bits mapped to low-degree variable nodes are allocated to higher-reliability bits among the bits in the modulation symbol.

2. The channel interleaving method of claim 1, wherein the channel interleaving rule allocates the codeword bits to a predetermined number of high-protected bit positions in ascending order of the degree.

3. A channel interleaving method in a communication system using a low density parity check (LDPC) code, the method comprising:

encoding information data bits into an LDPC codeword using a predetermined coding scheme upon receipt of the information bits;

interleaving the LDPC codeword according to a predetermined channel interleaving rule; and modulating the channel-interleaved LDPC codeword into a modulation symbol using a predetermined modulation scheme, wherein the channel interleaving rule is defined such that if a degree of a check node is greater than or equal to a threshold set in the system, codeword bits mapped to high-degree variable nodes are allocated to higher-reliability bits among the bits in the modulation symbol.

4. The channel interleaving method of claim 3, wherein the channel interleaving rule allocates the codeword bits to a predetermined number of high-protected bit positions in descending order of the degree.

5. A channel interleaving method in a communication system using a low density parity check (LDPC) code, the method comprising:

encoding information data bits into an LDPC codeword using a predetermined coding scheme upon receipt of the information bits;

interleaving the LDPC codeword according to a predetermined channel interleaving rule; and modulating the channel-interleaved LDPC codeword into a modulation symbol using a predetermined modulation scheme, wherein the channel interleaving rule is defined such that if a corresponding LDPC code is a chain-structured LDPC code in which low-degree variable nodes are chain-connected, a distance between parity bits mapped to high-reliability bits remains constant.

6. A channel deinterleaving method in a communication system using a low density parity check (LDPC) code, the method comprising:

demodulating a received signal using a demodulation scheme corresponding to a modulation scheme used for channel interleaving;

deinterleaving the demodulated signal using a channel deinterleaving scheme corresponding to a channel interleaving rule used for the channel interleaving; and decoding the channel-deinterleaved signal into information data bits using a decoding scheme corresponding to an LDPC codeword coding scheme used for the channel interleaving, wherein the channel interleaving rule is defined such that if a degree of a check node is lower than a threshold set in the system, codeword bits mapped to low-degree variable nodes are allocated to high-reliability bits among the bits in a modulation symbol, wherein the modulation symbol is generated by encoding the information data bits using the coding scheme and then modulating the encoded information data bits using the modulation scheme.

7. The channel deinterleaving method of claim 6, wherein the channel interleaving rule allocates the codeword bits to a predetermined number of high-protected bit positions in ascending order of the degree.

8. The channel deinterleaving method of claim 6, wherein the channel interleaving rule is defined such that if a degree of a check node is greater than or equal to a threshold set in the system, codeword bits mapped to high-degree variable nodes are allocated to high-reliability bits among the bits in a modulation symbol, wherein the modulation symbol is generated by encoding the information data bits using the coding scheme and then modulating the encoded information data bits using the modulation scheme.

9. The channel deinterleaving method of claim 8, wherein the channel interleaving rule allocates the codeword bits to a predetermined number of high-protected bit positions in descending order of the degree.

10. The channel deinterleaving method of claim 6, wherein the channel interleaving rule is defined such that if a corresponding LDPC code is a chain-structured LDPC code in which low-degree variable nodes are chain-connected, a distance between parity bits mapped to high-reliability bits remains constant.

11. The channel deinterleaving method of claim 6, wherein the channel interleaving rule is defined such that it allocates codeword bits mapped to low-degree variable nodes to high-reliability bits among the bits in a modulation symbol if a degree of a check node is lower than a threshold set in the system, allocates codeword bits mapped to high-degree variable nodes to the high-reliability bits among the bits in the modulation symbol if the degree of the check node is greater than or equal to the threshold set in the system, and maintains a distance between parity bits mapped to high-reliability bits if a corresponding LDPC code is a chain-structured LDPC code in which low-degree variable nodes are chain-connected, wherein the modulation symbol is generated by encoding the information data bits using the coding scheme and then modulating the encoded information data bits using the modulation scheme.

12. The channel deinterleaving method of claim 11, wherein if the degree of the check node is lower than the threshold, the codeword bits are allocated to a predetermined number of high-protected bit positions in ascending order of the degree.

13. The channel deinterleaving method of claim 11, wherein if the degree of the check node is greater than or equal to the threshold, the codeword bits are allocated to a predetermined number of high-protected bit positions in descending order of the degree.

14. A channel interleaving method in a communication system using a low density parity check (LDPC) code, the method comprising the steps of:

determining a degree of a check node from a parity check matrix of an LDPC code;

if the degree of the check node is lower than a threshold set in the system, channel-interleaving the LDPC code according to a first channel interleaving rule;

if the degree of the check node is greater than or equal to the threshold set in the system, channel-interleaving the LDPC code according to a second channel interleaving rule; and if the LDPC code is a chain-structured LDPC code in which parity bits are chain-connected, channel-interleaving the LDPC code according to a third channel interleaving rule,
wherein the third channel interleaving rule is defined such that for the chain-structured LDPC code in which low-degree variable nodes are chain-connected, a distance between parity bits mapped to high-reliability bits remains constant.

15. The channel interleaving method of claim 14, wherein the first channel interleaving rule is defined such that if a degree of a check node is lower than a threshold set in the system, codeword bits mapped to low-degree variable nodes are allocated to high-reliability bits among the bits in a modulation symbol.

16. The channel interleaving method of claim 15, wherein the first channel interleaving rule allocates the codeword bits to a predetermined number of high-protected bit positions in ascending order of the degree.

17. The channel interleaving method of claim 14, wherein the second channel interleaving rule is defined such that if a degree of a check node is greater than or equal to a threshold set in the system, codeword bits mapped to high-degree variable nodes are allocated to high-reliability bits among the bits in a modulation symbol.

18. The channel interleaving method of claim 17, wherein the second channel interleaving rule allocates the codeword bits to a predetermined number of high-protected bit positions in descending order of the degree.

19. A channel interleaving apparatus in a communication system using a low density parity check (LDPC) code, the apparatus comprising:
an encoder for encoding information data bits into an LDPC codeword using a predetermined coding scheme upon receipt of the information data bits;
a channel interleaver for interleaving the LDPC codeword according to a predetermined channel interleaving rule; and
a modulator for modulating the channel-interleaved LDPC codeword into a modulation symbol using a predetermined modulation scheme,
wherein the channel interleaving rule is defined such that if a degree of a check node is lower than a threshold set in the system, codeword bits mapped to low-degree variable nodes are allocated to high-reliability bits among the bits in the modulation symbol.

20. The channel interleaving apparatus of claim 19, wherein the channel interleaving rule allocates the codeword bits to a predetermined number of high-protected bit positions in ascending order of the degree.

21. The channel interleaving apparatus of claim 19, wherein the channel interleaving rule is defined such that if a degree of a check node is greater than or equal to a threshold set in the system, codeword bits mapped to high-degree variable nodes are allocated to high-reliability bits among the bits in the modulation symbol.

22. The channel interleaving apparatus of claim 19, wherein the channel interleaving rule allocates the codeword bits to a predetermined number of high-protected bit positions in descending order of the degree.

23. The channel interleaving apparatus of claim 19, wherein the channel interleaving rule is defined such that if a corresponding LDPC code is a chain-structured LDPC code in which low-degree variable nodes are chain-connected, a distance between parity bits mapped to high-reliability bits remains constant.

24. The channel interleaving apparatus of claim 19, wherein the channel interleaving rule is defined such that it allocates codeword bits mapped to low-degree variable nodes to high-reliability bits among the bits in the modulation symbol if a degree of a check node is lower than a threshold set in the system, allocates codeword bits mapped to high-degree variable nodes to the high-reliability bits among the bits in the modulation symbol if the degree of the check node is greater than or equal to the threshold set in the system, and maintains a distance between parity bits mapped to high-reliability bits if a corresponding LDPC code is a chain-structured LDPC code in which low-degree variable nodes are chain-connected.

25. The channel interleaving apparatus of claim 24, wherein if the degree of the check node is lower than the threshold, the codeword bits are allocated to a predetermined number of high-protected bit positions in ascending order of the degree.

26. The channel interleaving apparatus of claim 24, wherein if the degree of the check node is greater than or equal to the threshold, the codeword bits are allocated to a predetermined number of high-protected bit positions in descending order of the degree.

27. A channel deinterleaving apparatus in a communication system using a low density parity check (LDPC) code, the apparatus comprising:
a demodulator for demodulating a received signal using a demodulation scheme corresponding to a modulation scheme used in a channel interleaver;
a channel deinterleaver for deinterleaving the demodulated signal using a channel deinterleaving scheme corresponding to a channel interleaving rule used in a channel interleaver; and
a decoder for decoding the channel-deinterleaved signal into information data bits using a decoding scheme corresponding to an LDPC codeword coding scheme used in the channel interleaver,
wherein the channel interleaving rule is defined such that if a degree of a check node is lower than a threshold set in the system, codeword bits mapped to low-degree variable nodes are allocated to high-reliability bits among the bits in a modulation symbol, wherein the modulation symbol is generated by encoding the information data bits using the coding scheme and then modulating the encoded information data bits using the modulation scheme.

28. The channel deinterleaving apparatus of claim 27, wherein the channel interleaving rule allocates the codeword bits to a predetermined number of high-protected bit positions in ascending order of the degree.

29. The channel deinterleaving apparatus of claim 27, wherein the channel interleaving rule is defined such that if a degree of a check node is greater than or equal to a threshold set in the system, codeword bits mapped to high-degree variable nodes are allocated to high-reliability bits among the bits in a modulation symbol, wherein the modulation symbol is generated by encoding the information data bits using the coding scheme and then modulating the encoded information data bits using the modulation scheme.

30. The channel deinterleaving apparatus of claim 29, wherein the channel interleaving rule allocates the codeword bits to a predetermined number of high-protected bit positions in descending order of the degree.

31. The channel deinterleaving apparatus of claim 27, wherein the channel interleaving rule is defined such that if a corresponding LDPC code is a chain-structured LDPC code in which low-degree variable nodes are chain-connected, a distance between parity bits mapped to high-reliability bits remains constant.

32. The channel deinterleaving apparatus of claim 27, wherein the channel interleaving rule is defined such that it allocates codeword bits mapped to low-degree variable nodes to high-reliability bits among the bits in a modulation symbol if a degree of a check node is lower than a threshold set in the system, allocates codeword bits mapped to high-degree variable nodes to the high-reliability bits among the bits in the modulation symbol if the degree of the check node is greater than or equal to the threshold set in the system, and maintains a distance between parity bits mapped to high-reliability bits if a corresponding LDPC code is a chain-structured LDPC code in which low-degree variable nodes are chain-connected, wherein the modulation symbol is generated by encoding the information data bits using the coding scheme and then modulating the encoded information data bits using the modulation scheme.

33. The channel deinterleaving apparatus of claim 32, wherein if the degree of the check node is lower than the threshold, the codeword bits are allocated to a predetermined number of high-protected bit positions in ascending order of the degree.

34. The channel deinterleaving apparatus of claim 32, wherein if the degree of the check node is greater than or equal to the threshold, the codeword bits are allocated to a predetermined number of high-protected bit positions in descending order of the degree.

* * * * *

UNITED STATES PATENT AND TRADEMARK OFFICE
CERTIFICATE OF CORRECTION

PATENT NO. : 7,584,401 B2
APPLICATION NO. : 11/487201
DATED : September 1, 2009
INVENTOR(S) : Hong et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 336 days.

Signed and Sealed this

Fourteenth Day of September, 2010

David J. Kappos
*Director of the United States Patent and Trademark Office*